US012696673B2

(12) United States Patent
     Lin

(10) Patent No.:     US 12,696,673 B2
(45) Date of Patent:         Jul. 28, 2026

(54) DISPLAY DEVICES AND DISPLAY TERMINALS INCLUDING SOLDER PAD PART

(71) Applicant: Wuhan China Star Optoelectronics Semiconductor Display Technology Co., Ltd., Wuhan (CN)

(72) Inventor: Feiming Lin, Wuhan (CN)

(73) Assignee: Wuhan China Star Optoelectronics Semiconductor Display Technology Co., Ltd., Wuhan (CN)

( * ) Notice:    Subject to any disclaimer, the term of this patent is extended or adjusted under 35 U.S.C. 154(b) by 450 days.

(21) Appl. No.: 18/269,769

(22) PCT Filed: Apr. 21, 2023

(86) PCT No.: PCT/CN2023/089899
     § 371 (c)(1),
     (2) Date: Jun. 27, 2023

(87) PCT Pub. No.: WO2024/178821
     PCT Pub. Date: Sep. 6, 2024

(65) Prior Publication Data
     US 2025/0048906 A1      Feb. 6, 2025

(30) Foreign Application Priority Data

Feb. 28, 2023    (CN) ......................... 202310188138.8

(51) Int. Cl.
     *H10K 59/80*          (2023.01)
     *H10K 59/131*        (2023.01)
     *H10K 102/00*        (2023.01)
(52) U.S. Cl.
     CPC ....... *H10K 59/8794* (2023.02); *H10K 59/131* (2023.02); *H10K 59/8722* (2023.02); *H10K 59/8792* (2023.02); *H10K 2102/351* (2023.02)

(58) Field of Classification Search
     CPC ............. H10K 59/8794; H10K 59/131; H10K 59/8722; H10K 59/8792; H10K 59/10;
                         (Continued)

(56) References Cited

U.S. PATENT DOCUMENTS 11,087,110 B2 *   8/2021  Park ....................... H10K 59/60
11,183,653 B2 *  11/2021  Lee ......................... H10K 59/40
                         (Continued)

FOREIGN PATENT DOCUMENTS

CN           112289185           1/2021
CN           113539104          10/2021
                         (Continued)

OTHER PUBLICATIONS

International Search Report and the Written Opinion Dated Nov. 8, 2023 From the International Searching Authority Re. Application No. PCT/CN2023/089899 and Its Translation Into English. (15 Pages).

*Primary Examiner* — Ida M Soward

(57)                    ABSTRACT

A display device is provided. In this display device, a first backplate is disposed on a back side of a flat plate part; a second backplate is disposed on a side of a solder pad part; a rigid support layer is directly attached onto the first backplate; a buffer layer is directly attached onto the rigid support layer; a notch is provided at an end of the buffer layer close to a bending part; an adhesive layer is disposed in the notch, and the second backplate is attached onto a surface of the adhesive layer away from the rigid support layer; and a heat dissipation support layer is disposed on a side of the buffer layer.

20 Claims, 2 Drawing Sheets

(58) Field of Classification Search

CPC ...... H10K 50/842; H10K 77/111; G09F 9/30; G09F 9/33

See application file for complete search history.

(56) References Cited

U.S. PATENT DOCUMENTS

| | | | | |
|---|---|---|---|---|
| 11,468,832 B2 * | 10/2022 | Zhu | ...................... | H10H 20/857 |
| 11,631,836 B2 | 4/2023 | Xia | | |
| 11,656,702 B2 * | 5/2023 | Luo | ...................... | G06F 3/0412 |
| | | | | 345/173 |
| 11,758,764 B2 * | 9/2023 | Cha | ........................ | H10K 59/50 |
| 11,791,235 B2 * | 10/2023 | Ham | ................... | H01L 23/3735 |
| | | | | 361/707 |
| 2019/0006444 A1 * | 1/2019 | Nishimura | .......... | H04M 1/0269 |
| 2019/0339741 A1 * | 11/2019 | Park | .................... | H10K 50/844 |
| 2019/0340959 A1 * | 11/2019 | Park | .................... | H10K 77/111 |
| 2020/0022261 A1 * | 1/2020 | Choi | ................. | H05K 7/20963 |
| 2020/0127229 A1 * | 4/2020 | Noh | ................... | H10K 59/8791 |
| 2022/0181576 A1 * | 6/2022 | Cha | ..................... | H10K 77/111 |
| 2022/0209167 A1 * | 6/2022 | Park | ...................... | H10K 50/87 |
| 2022/0310964 A1 * | 9/2022 | Xia | .................... | H05K 7/20954 |
| 2023/0171905 A1 * | 6/2023 | Kwon | .................. | H10K 77/111 |
| | | | | 361/807 |
| 2023/0195173 A1 | 6/2023 | Yang et al. | | |
| 2025/0172970 A1 * | 5/2025 | Park | ...................... | H10K 59/38 |

FOREIGN PATENT DOCUMENTS

| | | | | | |
|---|---|---|---|---|---|
| CN | 113628543 A | * | 11/2021 | ............. | G09F 9/301 |
| CN | 113764356 | | 12/2021 | | |
| CN | 114038333 A | * | 2/2022 | ............. | G09F 9/301 |
| CN | 114093274 | | 2/2022 | | |
| CN | 114203048 | | 3/2022 | | |
| CN | 114300638 A | * | 4/2022 | ........... | H10K 77/111 |
| CN | 114550589 | | 5/2022 | | |
| CN | 114783296 A | * | 7/2022 | ............. | G09F 9/301 |
| CN | 115019662 A | * | 9/2022 | ............. | G09F 9/301 |
| CN | 114093274 B | * | 1/2023 | ............. | H05K 1/116 |
| KR | 20220080862 A | * | 6/2022 | ........... | H10K 50/844 |

* cited by examiner

DISPLAY DEVICES AND DISPLAY TERMINALS INCLUDING SOLDER PAD PART

RELATED APPLICATIONS

This application is a National Phase of PCT Patent Application No. PCT/CN2023/089899 having International filing date of Apr. 21, 2023, which claims the benefit of priority of China Patent Application No. 202310188138.8 filed on Feb. 28, 2023. The contents of the above applications are all incorporated by reference as if fully set forth herein in their entirety.

TECHNICAL FIELD

The present disclosure relates to display technologies, and in particular to display devices and display terminals including the same.

BACKGROUND

Organic electroluminescence display (OLED) devices have been widely used in daily life. An organic electroluminescence display device includes an organic electroluminescence display panel body. The organic electroluminescence display panel body is generally divided into a flat plate part, a bending part, and a solder pad part, to achieve a narrow border design of the organic electroluminescence display device. Generally, the flat plate part is a part for displaying images, the solder pad part is a part for binding or electrically connecting a driver chip and a circuit board, and the bending part is a part for bending to enable the solder pad part to be disposed on a back side of the flat plate part, so as to achieve the narrow border design. A multi-layer support layer with a plurality of functions is required to be designed on a back side of the flat plate part of the organic electroluminescence display panel body, and the solder pad part is disposed on a side of the multi-layer support layer away from the flat plate part after the bending part is bent, so that the organic electroluminescence display device has excellent performances.

However, the presence of the multi-layer support layer increases a bending radius of the bending part, resulting in a larger border of the organic electroluminescence display device at a location corresponding to the bending part.

Technical Problems

Embodiments of the present disclosure provide a display device and a display terminal, which can solve a problem of a larger border of an existing display device at a location corresponding to a bending part caused by increase of a bending radius of the bending part due to the presence of the multi-layer support layer.

Technical Solutions

An embodiment of the present disclosure provides a display device, which includes:

a display panel body including a flat plate part, a bending part, and a solder pad part, in which the bending part may be disposed between the flat plate part and the solder pad part, and the solder pad part may be disposed on a back side of the flat plate part in a bending state;

a backplate layer including a first backplate and a second backplate, in which the first backplate may be disposed on the back side of the flat plate part, and the second backplate may be disposed on a side of the solder pad part close to the flat plate part;

a rigid support layer attached onto a side of the first backplate away from the flat plate part;

a buffer layer attached onto a side of the rigid support layer away from the flat plate part;

a notch provided at an end of the buffer layer close to the bending part;

an adhesive layer disposed at the end of the buffer layer close to the bending part, in which the second backplate may be attached onto a surface of the notch through the adhesive layer; and a heat dissipation support layer disposed on a side of the buffer layer away from the flat plate part.

Optionally, in some embodiments of the present disclosure, a thickness of the buffer layer between the adhesive layer and the rigid support layer may be 0, and the second backplate may be attached onto a surface of the rigid support layer away from the flat plate part through the adhesive layer.

Optionally, in some embodiments of the present disclosure, a thickness of the buffer layer between the adhesive layer and the rigid support layer may be greater than 0, and the second backplate may be attached onto a surface of the buffer layer through the adhesive layer.

Optionally, in some embodiments of the present disclosure, an orthographic projection of the heat dissipation support layer on the flat plate part may do not overlap with an orthographic projection of the notch on the flat plate part.

Optionally, in some embodiments of the present disclosure, a thickness of a stacked layer between a surface of the flat plate part close to the heat dissipation support layer and a surface of the heat dissipation support layer away from the flat plate part may be greater than or equal to a thickness of a stacked layer between a surface of the flat plate part close to the second backplate and a surface of the solder pad part away from the flat plate part.

Optionally, in some embodiments of the present disclosure, the surface of the heat dissipation support layer away from the flat plate part and the surface of the solder pad part away from the flat plate part may be in a same plane.

Optionally, in some embodiments of the present disclosure, a height between a plane where the surface of the notch may be located and a plane where a surface of the heat dissipation support layer away from the flat plate part may be located may range from 100 microns to 235 microns.

Optionally, in some embodiments of the present disclosure, a height between a plane where the surface of the notch is located and a plane where a surface of the heat dissipation support layer away from the flat plate part is located may range from 50 microns to 80 microns.

Optionally, in some embodiments of the present disclosure, both of an elastic modulus of the rigid support layer and an elastic modulus of the heat dissipation support layer may be greater than an elastic modulus of the backplate layer, and the elastic modulus of the backplate layer may be greater than an elastic modulus of the buffer layer.

Optionally, in some embodiments of the present disclosure, materials of the rigid support layer may include stainless steel.

Optionally, in some embodiments of the present disclosure, a thickness of the buffer layer between the adhesive layer and the rigid support layer may be 0, and materials of the buffer layer may include at least one of silica gel and polyurethane.

Optionally, in some embodiments of the present disclosure, a thickness of the buffer layer between the adhesive layer and the rigid support layer may be greater than 0, and materials of the buffer layer may include a foam.

Optionally, in some embodiments of the present disclosure, materials of the heat dissipation support layer may include at least one of stainless steel, copper alloy, and carbon fiber.

Optionally, in some embodiments of the present disclosure, materials of the heat dissipation support layer may include at least one of stainless steel, copper alloy, and carbon fiber.

An embodiment of the present disclosure also provides a display terminal, which includes a terminal body and a display device integrated with the terminal body, and the display device may include:

a display panel body including a flat plate part, a bending part, and a solder pad part, in which the bending part may be disposed between the flat plate part and the solder pad part, and the solder pad part may be disposed on a back side of the flat plate part in a bending state;

a backplate layer including a first backplate and a second backplate, in which the first backplate may be disposed on the back side of the flat plate part, and the second backplate may be disposed on a side of the solder pad part close to the flat plate part;

a rigid support layer attached onto a side of the first backplate away from the flat plate part;

a buffer layer attached onto a side of the rigid support layer away from the flat plate part;

a notch provided at an end of the buffer layer close to the bending part;

an adhesive layer disposed at the end of the buffer layer close to the bending part, in which the second backplate may be attached onto a surface of the notch through the adhesive layer; and a heat dissipation support layer disposed on a side of the buffer layer away from the flat plate part.

Optionally, in some embodiments of the present disclosure, a thickness of the buffer layer between the adhesive layer and the rigid support layer may be 0, and the second backplate may be attached onto a surface of the rigid support layer away from the flat plate part through the adhesive layer.

Optionally, in some embodiments of the present disclosure, a thickness of the buffer layer between the adhesive layer and the rigid support layer may be greater than 0, and the second backplate may be attached onto a surface of the buffer layer through the adhesive layer.

Optionally, in some embodiments of the present disclosure, an orthographic projection of the heat dissipation support layer on the flat plate part may do not overlap with an orthographic projection of the notch on the flat plate part.

Optionally, in some embodiments of the present disclosure, a gap may be defined between the orthographic projection of the heat dissipation support layer on the flat plate part and the orthographic projection of the notch on the flat plate part.

Beneficial Effects

Embodiments of the present disclosure provide a display device and a display terminal, and the display device includes: a display panel body including a flat plate part, a bending part, and a solder pad part, in which the bending part may be disposed between the flat plate part and the solder pad part, and the solder pad part may be disposed on a back side of the flat plate part in a bending state; a backplate layer including a first backplate and a second backplate, in which the first backplate may be disposed on a back side of the flat plate part, and the second backplate may be disposed on a back side of the solder pad part; a rigid support layer disposed on a side of the first backplate away from the flat plate part; a buffer layer disposed on a side of the rigid support layer away from the flat plate part; a notch provided at an end of the buffer layer close to the bending part; an adhesive layer disposed on a side of the buffer layer close to the bending part, in which the second backplate may be attached onto a surface of the notch through the adhesive layer; and a heat dissipation support layer disposed on a side of the buffer layer away from the flat plate part. On a basis of retaining all functions of an existing multi-layer support layer, the present disclosure can replace the existing multi-layer support layer with a thinner multi-layer support layer; at the same time, because the notch may be provided at the end close to the bending part, and the second backplate may be attached onto the surface of the notch through the adhesive layer, a thickness of the multi-layer support layer between the solder pad part and the flat plate part can be reduced in the present disclosure, which can greatly reduce a bending radius of the bending part, thereby reducing a border of the display device at a location corresponding to the bending part, which is advantageous to narrow the border. Furthermore, the rigid support layer may be directly attached onto a side of the first backplate away from the flat plate part, and the buffer layer may be directly attached onto a side of the rigid support layer away from the flat plate part, that is, the rigid support layer can be closer to the flat plate part, so as to achieve a support effect and a shading effect for the entire flat plate part, thereby avoiding appearances of imprint marks and light leakage. Moreover, because the buffer layer can play a role in buffering impact, extrusion, and pressing of external forces, and the adhesive layer can play a role in cohering the solder pad part and the multi-layer support layer, and buffering external forces applying on the solder pad part, the multi-layer support layer in the present disclosure has all functions of the multi-layer support layer in the existing art, such as light-shielding, buffering, and support functions, which can replace the multi-layer support layer in the existing art; at the same time, compared to the display device in the existing art, the display device in the present disclosure brings functions of avoiding an appearance of imprint marks and narrowing the border.

DESCRIPTION OF DRAWINGS

In order to explain technical solutions in the embodiments of the present disclosure more clearly, the following will briefly introduce the drawings needed to be used in description of the embodiments. Obviously, the drawings in the following description are only some embodiments of the present disclosure. For those skilled in the art, other drawings can be obtained from these drawings without paying creative effort.

Figure 1:
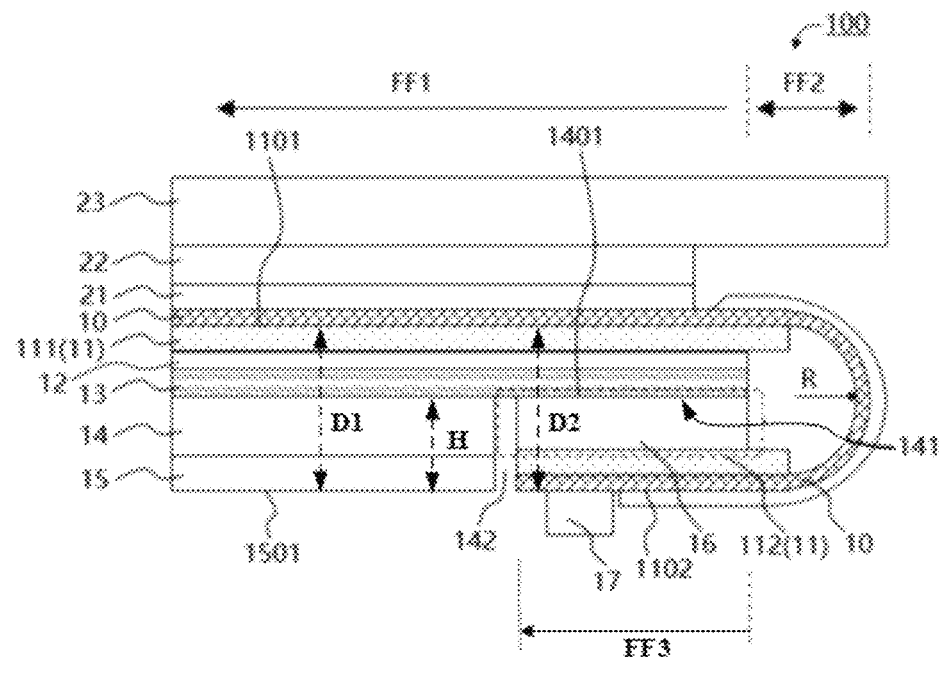
FIG. 1 is a schematic cross-sectional diagram of a display panel according to an embodiment 1 of the present disclosure.

REFERENCE NUMERALS display device 100, display panel body 10, backplate layer 11, first adhesive layer 12, rigid support layer 13, buffer layer 14, adhesive layer 16, and heat dissipation support layer 15;

flat plate part FF1, bending part FF2, solder pad part FF3, first backplate 111, second backplate 112, and notch 141;

driver chip 17, polarizer 21, protective cover plate 23, optical adhesive layer 22, and pressing head 31;

first surface 1101, second surface 1501, third surface 1102, and fourth surface 1401;

bending radius R and gap 142; and display terminal 200 and terminal body 2011.

DETAILED DESCRIPTION

In combination with drawings in the embodiments of the disclosure, technical solutions in the embodiments of the disclosure will be described clearly and completely. Obviously, the described embodiments are only part of the embodiments of the disclosure, not all of them. Based on the embodiments of the disclosure, all other embodiments obtained by those skilled in the art without creative effort belong to a scope of the disclosure. In addition, it should be understood that specific embodiments described herein are only used to explain and interpret the disclosure and are not used to limit the disclosure. In the disclosure, location terms used, such as "up" and "down", generally refer to up and down in actual using or working state of devices, in particular drawing directions in the drawings, unless otherwise described; terms "inside" and "outside" refer to outlines of the devices.

Embodiments of the present disclosure provide a display device, which includes a display panel body, a backplate layer, a rigid support layer, a buffer layer, a notch, an adhesive layer, and a heat dissipation support layer. The display panel body includes a flat plate part, a bending part, and a solder pad part, the bending part is disposed between the flat plate part and the solder pad part, and the solder pad part is disposed on a back side of the flat plate part in a bending state. The backplate layer includes a first backplate and a second backplate, the first backplate is disposed on a back side of the flat plate part, and the second backplate is disposed on a back side of the solder pad part. The rigid support layer is disposed on a side of the first backplate away from the flat plate part. The buffer layer is disposed on a side of the rigid support layer away from the flat plate part. The notch is provided at an end of the buffer layer close to the bending part. The adhesive layer is disposed at the end of the buffer layer close to the bending part, and the second backplate is attached onto a surface of the notch through the adhesive layer. The heat dissipation support layer is disposed on a side of the buffer layer away from the flat plate part.

Embodiments of the present disclosure also provide a display terminal including the above-mentioned display device. The following are described in detail. It should be noted that a description order of the following embodiments does not serve as a limitation to a preferred order of the embodiments.

Embodiment 1

Figure 2:
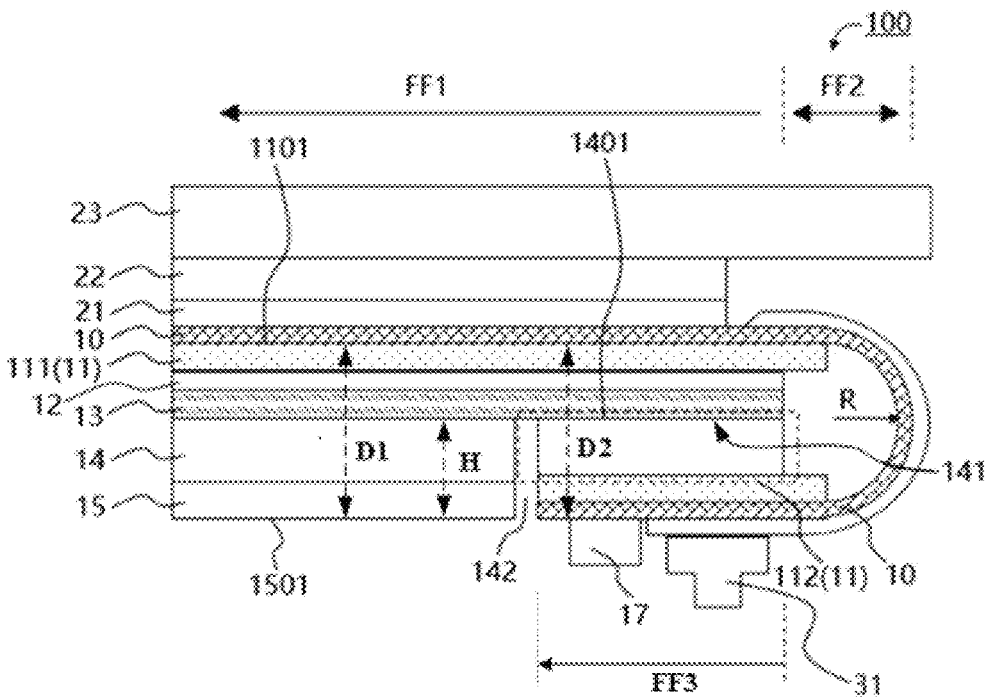
FIG. 2 is a schematic diagram of a bending part of the display panel when a pressing force is applied on the bending part in a bending state according to the embodiment 1 of the present disclosure.

Referring to FIG. 1 and FIG. 2, FIG. 1 is a schematic cross-sectional diagram of a display panel according to the embodiment 1 of the present disclosure, and FIG. 2 is a schematic diagram of a bending part of the display panel when a pressing force is applied on the bending part in the bending state according to the embodiment 1 of the present disclosure.

The embodiment of the present disclosure provides a display device 100, which includes a display panel body 10, a backplate layer 11, a rigid support layer 13, a buffer layer 14, a notch 141, and an adhesive layer 16. The display panel body 10 includes a flat plate part FF1, a bending part FF2, and a solder pad part FF3. The bending part FF2 is disposed between the flat plate part FF1 and the solder pad part FF3. The solder pad part FF3 is disposed on a back side of the flat plate part FF1 in the bending state. The backplate layer 11 includes a first backplate 111 and a second backplate 112. The first backplate 111 is disposed on a back side of the flat plate part FF1. The second backplate 112 is disposed on a side of the solder pad part FF3 close to the flat plate part FF1. The rigid support layer 13 is attached onto a side of the first backplate 111 away from the flat plate part FF1. The buffer layer 14 is attached onto a side of the rigid support layer 13 away from the flat plate part FF1. The notch 141 is provided at an end of the buffer layer 14 close to the bending part FF2. The adhesive layer 16 is disposed at the end of the buffer layer 14 close to the bending part FF2. The second backplate 112 is attached onto a surface of the notch 141 through the adhesive layer 16. A heat dissipation support layer 15 is disposed on a side of the buffer layer 14 away from the flat plate part FF1.

Specifically, in the bending state, because the solder pad part FF3 is disposed on the back side of the flat plate part FF1, a border of the display device 100 can be reduced.

Specifically, the solder pad part FF3 includes solder pad terminals, and the display device 100 is electrically connected to a driver chip 17 and/or a circuit board through the solder pad terminals.

Specifically, in some embodiments, the display device 100 may include a polarizer 21, a protective cover plate 23 ((a cover glass (CG) or a window)), and an optical adhesive layer 22 ((an optically clear adhesive (OCA) or an optical clear resin (OCR))) disposed between the polarizer 21 and the protective cover plate 23. Specifically, the polarizer 21 is disposed on a display side of the display panel body 10, and the protective cover plate 23 is disposed on a side of the polarizer 21 away from the display panel body 10.

Specifically, the display side of the display panel body 10 or a display side of the flat plate part FF1 refers to a side where an image displays, or light emits, or human eyes observe. The back side of the flat plate part FF1 refers to a side of the flat plate part FF1 close to the solder pad part FF3 or away from the protective cover plate 23. A back side of the solder pad part FF3 refers to a side of the solder pad part FF3 close to the flat plate part FF1.

Specifically, the backplate layer 11 includes the first back panel 111 and the second back panel 112 in which the first back panel 111 is disposed on the back side of the flat plate part FF1, and the second back panel 112 is disposed on the side of the solder pad part FF3 facing the flat plate part FF1. The backplate 11 can be achieved or prepared by attaching a patterned backplate layer 11 onto the back side of the display panel body 10 before the bending part FF2 is bent.

Specifically, before the bending part FF2 is bent, the first backplate 111 can be disposed on the back side of the flat plate part FF1, and the second backplate 112 can be disposed on the side of the solder pad part FF3 close to the flat plate part FF1. That is, before the bending part FF2 is bent, the first backplate 111 and the second backplate 112 can be disposed on a same side of the display panel body 10.

Specifically, as shown in FIG. 1, the backplate layer 11 includes a first backplate 111 and a second backplate 112. After the bending part FF2 is bent, the first backplate 111 is disposed on the back side of the flat plate part FF1, and the second backplate 112 is disposed on the side of the solder pad part FF3 facing the flat plate part FF1.

Specifically, as shown in FIG. 1, in the bending state, the rigid support layer 13 is disposed on the side of the first backplate 111 away from the flat plate part FF1, and the rigid support layer 13 can be attached onto a surface of a side of the first backplate 111 away from the flat plate part FF1 through a first adhesive layer 12.

Specifically, the buffer layer 14 is attached onto a side of the rigid support layer 13 away from the flat plate part FF1, and the notch 141 is provided at the end of the buffer layer 14 close to the bending part FF2. That is, the notch 141 is provided on a side of the entire buffer layer 14 close to the bending part FF2, or the notch 141 is provided on a side of a part of the buffer layer 14 close to the bending part FF2.

Specifically, the adhesive layer 16 is disposed at the end of the buffer layer 14 close to the bending part FF2, the second backplate 112 is attached onto the surface of the notch 141 through the adhesive layer 16, and the notch 141 is configured to accommodate the solder pad part FF3, so that the solder pad part FF3 does not overlap with the buffer layer 14.

It should be noted that in the present disclosure, a film layer is attached onto another film layer, indicating that there may be a film layer between these two film layers other than an adhesive layer.

Specifically, in the bending state, layers of the display device 100 at a location corresponding to the solder pad part FF3 includes the solder pad part FF3, the second backplate 112, the adhesive layer 16, the rigid support layer 13, the first backplate 111, and the flat plate part FF1 disposed in stack. Layers of the display device 100 at a location corresponding to the buffer layer 14 includes the heat dissipation support layer 15, the buffer layer 14, the rigid support layer 13, the first backplate 111, and the flat plate part FF1.

Specifically, the heat dissipation support layer 15 can not only play a role in heat dissipation, but also in auxiliary support.

On a basis of retaining all functions of an existing multi-layer support layer, this embodiment can replace the existing multi-layer support layer with a thinner multi-layer support layer; at the same time, because the notch 141 is provided at the end of the buffer layer 14 close to the bending part FF2, and the second backplate 112 is attached onto the surface of the notch 141 through the adhesive layer 16, a thickness of the multi-layer support layer between the solder pad part FF3 and the flat plate part FF1 can be reduced, which can greatly reduce a bending radius R of the bending part FF2, thereby reducing a border of the display device 100 at a location corresponding to the bending part FF2, which is conducive to narrow the border. In addition, the rigid support layer 13 is attached onto a side of the first backplate 111 away from the flat plate part FF1, and the buffer layer 14 is attached onto a side of the rigid support layer 13 away from the flat plate part FF1, that is, the rigid support layer 13 is closer to the flat plate part FF1, so as to achieve a support effect and a shading effect for the entire flat plate part FF1, thereby avoiding appearances of imprint marks and light leakage. Moreover, the buffer layer 14 can play a role in buffering impact, extrusion, and pressing of external forces, and the adhesive layer 16 can play a role in cohering the solder pad part FF3 and the multi-layer support layer, and buffering external forces applying on the solder pad part FF3. Therefore, the multi-layer support layer in the present disclosure not only has all functions of the existing multi-layer support layer in the existing art, such as light-shielding, buffering, and support, but also can replace the existing multi-layer support layer in the existing art; at the same time, compared to a display device in the existing art, the display device in the present disclosure has functions of avoiding an appearance of imprint marks and narrowing the border.

In some embodiments, a thickness of the buffer layer 14 between the adhesive layer 16 and the rigid support layer 13 is 0, and the second backplate 112 is attached onto a surface of the rigid support layer 13 through the adhesive layer 16.

Specifically, when the thickness of the buffer layer 14 between the adhesive layer 16 and the rigid support layer 13 is designed to be 0, a shape of the buffer layer 14 can be more regular, which is conducive to attachment of the buffer layer 14. Moreover, the notch 141 can have a greater depth in a direction perpendicular to the flat plate part FF1, which can further reduce the bending radius R of the bending part FF2, thereby further reducing the border of the display device at a location corresponding to the bending part FF2, which is conducive to narrow the border.

Furthermore, the second backplate 112 is attached onto the surface of the rigid support layer 13 through the adhesive layer 16, that is, only the adhesive layer 16 is disposed between the second backplate 112 and the rigid support layer 13, which can further reduce the bending radius.

In some embodiments, the display device 100 further includes the heat dissipation support layer 15 disposed on a side of the buffer layer 14 away from the flat plate part FF1. An orthographic projection of the heat dissipation support layer 15 on the flat plate part FF1 does not overlap with an orthographic projection of the notch 141 on the flat plate part FF1.

Specifically, in the bending state, layers of the display device 100 at a location corresponding to the solder pad part FF3 includes the solder pad part FF3, the second backplate 112, the adhesive layer 16, the rigid support layer 13, the first backplate 111, and the flat plate part FF1 disposed in stack. Layers of the display device 100 at a location corresponding to the buffer layer 14 includes the heat dissipation support layer 15, the buffer layer 14, the rigid support layer 13, the first backplate 111, and the flat plate part FF1 disposed in stack.

In some embodiments, a gap 142 is formed between the orthographic projection of the heat dissipation support layer 15 on the flat plate part FF1 and the orthographic projection of the notch 141 on the flat plate part FF1.

Specifically, due to the presence of the gap 142, none of the adhesive layer 16, the second backplate 112, and the solder pad part FF3 is connected to or in contact with any of the buffer layer 14 and the heat dissipation support layer 15. As shown in FIG. 2, in the bending state, a pressing force from the pressing head 31 may be applied on the solder pad part FF3. The pressing force from the pressing head 31 may not be transmitted to the buffer layer 14 and the heat dissipation support layer 15 due to the presence of the gap 142, thereby avoiding imprint marks on the flat plate part FF1 corresponding to the heat dissipation support layer 15.

It should be noted that FIG. 1 illustrates that a surface of the flat plate part FF1 close to the heat dissipation support layer 15 and a surface of the flat plate part FF1 close to the second backplate 112 are defined as a first surface 1101, a surface of the heat dissipation support layer 15 away from the flat plate part FF1 is defined as a second surface 1501, a surface of the solder pad part FF3 away from the flat plate part FF1 is defined as a third surface 1102, and the surface of the notch 141 is defined as a fourth surface 1401.

In some embodiments, a thickness D1 of a stacked layer between the surface of the flat plate part FF1 close to the heat dissipation support layer 15 and the surface of the heat dissipation support layer 15 away from the flat plate part FF1 is greater than or equal to a thickness D2 of a stacked layer between the surface of the flat plate part FF1 close to the second backplate 112 and the surface of the solder pad part FF3 away from the flat plate part FF1.

Specifically, the thickness D1 of the stacked layer between the surface of the flat plate part FF1 close to the heat dissipation support layer 15 and the surface of the heat dissipation support layer 15 away from the flat plate part FF1 is greater than or equal to the thickness D2 of the stacked layer between the surface of the flat plate part FF1 close to the second backplate 112 and the surface of the solder pad part FF3 away from the flat plate part FF1, that is, a thickness D1 of a stacked layer between the first surface 1101 and the second surface 1501 is greater than or equal to a thickness D2 of a stacked layer between the first surface 1101 and the third surface 1102, making the solder pad part FF3 not protrude relative to the heat dissipation support layer 15 in a direction perpendicular to the flat plate part FF1, so as to improve flatness of a back surface of the display device 100, which is conductive to a design of regular space of terminals or entire machines to place the display device 100, and can enhance convenience of the terminals or the entire machines in accommodating the display device 100.

In some embodiments, the surface of the heat dissipation support layer 15 away from the flat plate part FF1 is in the same plane as the surface of the solder pad part FF3 away from the flat plate part FF1.

Specifically, the surface of the heat dissipation support layer 15 away from the flat plate part FF1 and the surface of the solder pad part FF3 away from the flat plate part FF1 are in a same plane. That is, the second surface 1501 and the third surface 1102 are in the same plane, making the back surface of the display device 100 smoother, which is more conductive to the design of regular space of the terminals or the entire machines to place the display device 100, so as to enhance convenience of the terminals or the entire machines in accommodating the display device 100.

In some embodiments, a height H between a plane where the fourth surface 1401 of the notch 141 is located and a plane where the surface of the heat dissipation support layer 15 away from the flat plate part FF1 is located ranges from 100 microns to 235 microns.

Specifically, by designing the height between the plane where the fourth surface 1401 of the notch 141 is located and the plane where the surface of the heat dissipation support layer 15 away from the flat plate part FF1 is located ranging from 100 microns to 235 microns, compared to a bending radius of a display device 100 being 500 microns in the existing art, a bending diameter of the bending part FF2 can be reduced from 100 microns to 235 microns.

In some embodiments, both of an elastic modulus of the rigid support layer 13 and an elastic modulus of the heat dissipation support layer 15 are greater than an elastic modulus of the backplate layer 11, and the elastic modulus of the backplate layer 11 is greater than an elastic modulus of the buffer layer 14.

Specifically, the rigid support layer 13 is disposed to provide good support for the flat plate part FF1, so that the flat plate part FF1 has a flat or smooth display surface.

Specifically, the rigid support layer 13 is made of opaque materials, so as to prevent external light from passing through the display panel body 10 to reach the display side, thereby preventing external light from affecting a display effect, and thus improving image quality of the display device 100 in a dark state. In addition, other support film layers on the back side of the flat plate part FF1 may also be or not be made of black materials; for example, the buffer layer 14 can be made of white foams or black foams to increase the range of available materials.

Specifically, although the rigid support layer 13 can provide a certain support effect, a thickness of the rigid support layer 13 may not be too large, so as to minimize the bending radius of the bending part FF3. The heat dissipation support layer 15 plays a role in heat dissipation and support. The heat dissipation support layer 15 can support the flat plate part FF1; moreover, materials of the heat dissipation support layer 15 with a good heat dissipation performance can be selected to dissipate heat better.

Specifically, the buffer layer 14 can play a role in buffering impact, extrusion, and pressing of an external force, so as to avoid an acting force generated from impact, extrusion, and pressing applied on the flat plate part FF1, thereby avoiding damage to the display panel body 10.

Specifically, the backplate layer 11 can play a role in supporting the display panel body 10.

Specifically, the adhesive layer 16 has a certain elasticity and can play a role in buffering the solder pad part FF3.

In some embodiments, materials of the rigid support layer 13 include stainless steel.

Specifically, the materials of the rigid support layer 13 include but are not limited to stainless steel, and may be other suitable materials.

In some embodiments, the thickness of the buffer layer 14 between the adhesive layer 16 and the rigid support layer 13 is 0, and materials of the buffer layer 14 include at least one of silica gel and polyurethane.

Specifically, the materials of the buffer layer 14 include at least one of silica gel and polyurethane, but are not limited to them, and may be other suitable materials.

Specifically, the inventor verified and found that when the thickness of the buffer layer 14 between the adhesive layer 16 and the rigid support layer 13 is 0, and the materials of the buffer layer 14 include at least one of silica gel and polyurethane, the best beneficial effect of the present disclosure may be achieved. Moreover, due to a thinner thickness and a better elasticity of the buffer layer 14 made of silica gel and polyurethane, it is suitable for a design of the notch 141 in the embodiment.

Furthermore, the materials of the buffer layer 14 also include at least one of foams and pressure sensitive adhesives. Because silica gel and polyurethane have large elasticity, a smaller thickness of the buffer layer 14 made of silica gel and/or polyurethane can be used to obtain enough elasticity, which can not only achieve an excellent buffering effect, but also can reduce the thickness of the buffer layer 14.

In some embodiments, materials of the heat dissipation support layer 15 include at least one of stainless steel, copper alloy, and carbon fiber.

Specifically, the materials of the heat dissipation support layer 15 include at least one of stainless steel, copper alloy, and carbon fiber, but are not limited to them, and may be other suitable materials.

In this embodiment, by designing the notch 141 at the end of the buffer layer 14 close to the bending part FF2, and the second backplate 112 being attached onto the fourth surface 1401 of the notch 141 through the adhesive layer 16, a thickness of a multi-layer support layer corresponding to the solder pad part FF3 can be reduced, so as to reduce the bending radius R of the bending part FF2, thereby reducing the border of the display device at a location corresponding to the bending part FF2, which is conducive to narrowing the border.

In this embodiment, by designing the rigid support layer 13 between the first backplate 111 and the buffer layer 14, so that the rigid support layer 13 can play a role in supporting the entire flat plate part FF1. Moreover, a design of the heat dissipation support layer 15 can strengthen a support effect on the flat plate part, so that the rigid support layer 13 can be designed to have a smaller thickness, making the multi-layer support layer have a plurality of functions, so as to make the thickness of the multi-layer support layer corresponding to the solder pad part FF3 smaller, thereby reducing the bending radius of the bending part FF2, which is conducive to narrowing the border.

In the embodiment, the design of the gap 142 separates the heat dissipation support layer 15 and other film layers from the solder pad part FF3, so that the pressing head does not extrude or press the heat dissipation support layer 15 in a bending process of the bending part FF2 (a pad bending process), which can reduce imprint marks.

On a basis of retaining all functions of an existing multi-layer support layer, this embodiment can replace the existing multi-layer support layer with a thinner multi-layer support layer; at the same time, because the notch 141 is provided at the end of the buffer layer 14 close to the bending part FF2, and the second backplate 112 is attached onto the fourth surface 1401 of the notch 141 through the adhesive layer 16, a thickness of the multi-layer support layer between the solder pad part FF3 and the flat plate part FF1 can be reduced, which can greatly reduce a bending radius R of the bending part FF2, thereby reducing a border of the display device 100 at a location corresponding to the bending part FF2, which is conducive to narrow the border. Moreover, the rigid support layer 13 is directly attached onto a side of the first backplate 111 away from the flat plate part FF1, and the buffer layer 14 is directly attached onto a side of the rigid support layer 13 away from the flat plate part FF1, that is, the rigid support layer 13 is closer to the flat plate part FF1, so as to achieve a support effect and a shading effect for the entire flat plate part FF1, thereby avoiding appearances of imprint marks and light leakage. Moreover, the buffer layer 14 can play a role in buffering impact, extrusion, and pressing of external forces, and the adhesive layer 16 can play a role in cohering the solder pad part FF3 and the multi-layer support layer, and buffering external forces applying on the solder pad part FF3 . . . Therefore, the multi-layer support layer in the present disclosure has all functions of the existing multi-layer support layer in the existing art, such as light-shielding, buffering, and support, and can replace the existing multi-layer support layer in the existing art. At the same time, compared to a display device in the existing art, the display device in the present disclosure has more functions of avoiding an appearance of imprint marks and narrowing the border.

Embodiment 2

Figure 3:
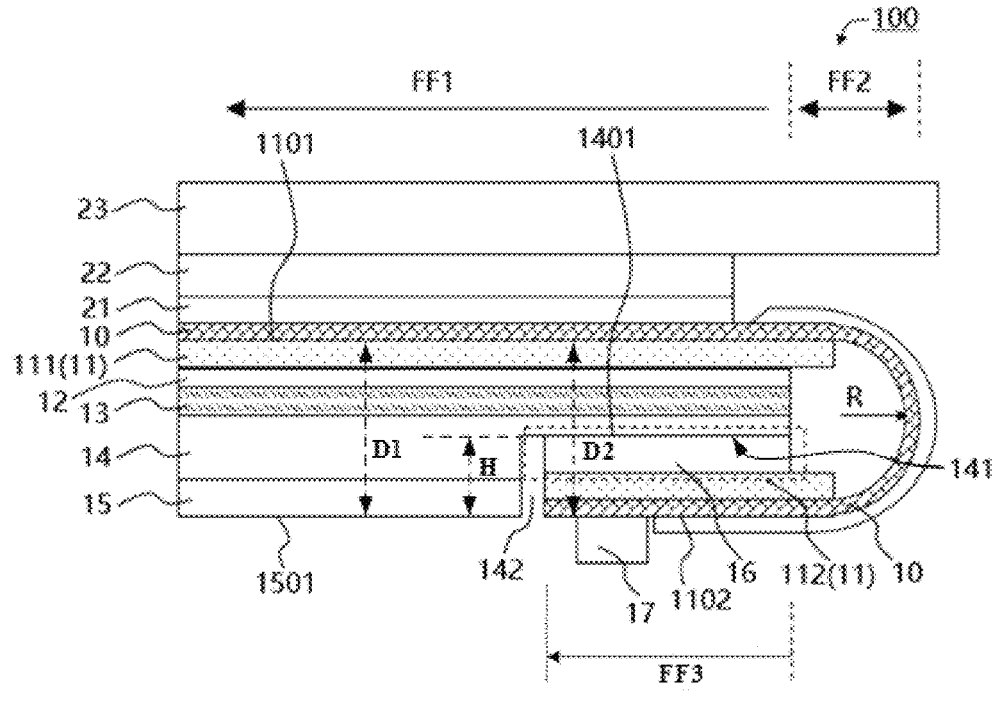
FIG. 3 is a schematic cross-sectional diagram of a display panel according to an embodiment 2 of the present disclosure.

Referring to FIG. 3, FIG. 3 is a schematic cross-sectional diagram of a display panel according to the embodiment 2 of the present disclosure.

The display device provided by this embodiment is the same as or similar to the display device 100 in the embodiment 1, similarities will not be repeated here, and only differences are described.

In some embodiments, a thickness of the buffer layer 14 between the adhesive layer 16 and the rigid support layer 13 is greater than 0, and the second backplate 112 is attached onto a surface of the buffer layer 14 through the adhesive layer 16. Specifically, the thickness of the buffer layer 14 between the adhesive layer 16 and the rigid support layer 13 is designed to be greater than 0, a surface of the buffer layer 14 away from the flat plate part FF1 is defined as the fourth surface 1401 of the notch 141, so that a part of the buffer layer 14 corresponding to the second backplate 112 is thinned to form the notch 141. The adhesive layer 16 is attached between the buffer layer 14 corresponding to the notch 141 and the second backplate 112.

Specifically, a part of the buffer layer 14 is disposed to correspond to the notch 141 to improve a buffering performance of the part of the buffer layer 14, thereby preventing impact or impulse, and an acting force of the pressing head 31 from damaging the display panel body 10.

Furthermore, the second backplate 112 is attached onto a surface of the buffer layer 14 through the adhesive layer 16, that is, only the adhesive layer 16 is disposed between the buffer layer 14 and the second backplate 112, so as to further reduce a bending radius.

In some embodiments, a thickness of the buffer layer 14 between the adhesive layer 16 and the rigid support layer 13 is greater than 0, and materials of the buffer layer 14 include foams.

Specifically, the inventor verified and found that when the thickness of the buffer layer 14 between the adhesive layer 16 and the rigid support layer 13 is greater than 0, and the materials of the buffer layer 14 include foams, the best beneficial effect of the present disclosure can be achieved. Moreover, due to a thicker thickness and a better elasticity of the buffer layer 14 made of foams, it is suitable for a design of the notch 141 in the embodiment.

In some embodiments, a height between a plane where the fourth surface 1401 of the notch 141 is located and a plane where a surface of the heat dissipation support layer 15 away from the flat plate part FF1 is located ranges from 50 microns to 80 microns.

Specifically, the height H between the plane where the surface fourth surface 1401 of the notch 141 is located and the plane where the surface of the heat dissipation support layer 15 away from the flat plate part FF1 is located ranges from 50 microns to 80 microns, so that a bending diameter of the bending part FF2 can be reduced to a range between 50 microns and 80 microns.

On a basis of retaining all functions of an existing multi-layer support layer, this embodiment can replace the existing multi-layer support layer with a thinner multi-layer support layer. Meanwhile, because the notch 141 is provided at the end of the buffer layer 14 close to the bending part FF2, and the second backplate 112 is attached onto the fourth surface 1401 of the notch 141 through the adhesive layer 16, a thickness of the multi-layer support layer between the solder pad part FF3 and the flat plate part FF1 can be reduced, which can greatly reduce a bending radius R of the bending part FF2, thereby reducing a border of the display device 100 at a location corresponding to the bending part FF2, which is conducive to narrow the border. Moreover, the rigid support layer 13 is attached onto a side of the first backplate 111 away from the flat plate part FF1, and the buffer layer 14 is attached onto a side of the rigid support layer 13 away from the flat plate part FF1, that is, the rigid support layer 13 is closer to the flat plate part FF1, so as to achieve a support effect and a shading effect for the entire flat plate part FF1, thereby avoiding appearances of imprint marks and light leakage. Moreover, the buffer layer 14 can play a role in buffering impact, extrusion, and pressing of external forces, and the adhesive layer 16 can play a role in cohering the solder pad part FF3 and the multi-layer support layer, and buffering external forces applying on the solder pad part FF3. Therefore, the multi-layer support layer in the present disclosure not only has all functions of the existing multi-layer support layer in the existing art, such as light-shielding, buffering, and support, but also can replace the existing multi-layer support layer in the existing art; at the same time, compared to a display device in the existing art, the display device in the present disclosure has functions of avoiding an appearance of imprint marks and narrowing the border.

In this embodiment, the thickness of the buffer layer 14 between the adhesive layer 16 and the rigid support layer 13 is designed to be greater than 0, and the fourth surface 1401 of the notch 141 is a surface of the buffer layer 141 away from the flat plate part FF1, so that a buffering effect of the buffer layer 14 on the solder pad part FF3 can be further improved, so as to further avoid appearance of imprint marks.

Tests and verifications are provided to verify beneficial effects of the display device 100 in the embodiment of the present disclosure. As shown in table 1, which illustrates test results on a condition that a back surface of the display device 100 is extruded. Among four groups of experimental results, a display device in the comparative example is a display device in the existing art. Compared to the display device in the comparative example, it can be seen that a design of the notch in the display device of the embodiment 1 can increase a thickness of layers between the first backplate and the heat dissipation support layer; in addition, in combination with a design of a new structure of the increased. For example, a thickness of the buffer layer between the first backplate and the heat dissipation support layer can be increased, so as to improve the anti-extrusion performance of the back surface of the display device, and a total thickness of the display device cannot be increased. Both of the embodiment 2-1 and the embodiment 2-2 are test results of the display device in the embodiment 2. Compared to the display device in the comparative example, it can be seen that although a thickness of layers between the first backplate and the heat dissipation support layer can be reduced in the embodiment 2-1 and the embodiment 2-2, a design of a new structure of the display device in the embodiment 2 can greatly increase a minimum pressure of the display device when bright spots or black spots appear, that is, a back surface of the display device in the embodiment 2 has an excellent anti-extrusion performance. A difference between the embodiment 2-1 and the embodiment 2-2 is that materials of the buffer layers are different. A material of the buffer layer 14 in the embodiment 2-1 is silica gel, and a material of the buffer layer 14 in the embodiment 2-2 is polyurethane. By comparing the embodiment 2-1 and the embodiment 2-2, it can be seen that the use of different materials in the buffer layers 14 can make back surfaces of the display devices have different anti-extrusion performances. Compared to polyurethane, the use of silica gel in the buffer layer 14 can make the back surface of the display device have a better anti-extrusion performance. It can be seen that a structure of the multi-layer support layer in the embodiments of the present disclosure not only has all functions of the existing multi-layer support layer in the existing art, such as light-shielding, buffering, and support, but also can replace the existing multi-layer support layer in the existing art. At the same time, compared to the display device in the existing art, the display device in the present disclosure has functions of avoiding an appearance of imprint marks, reducing a total thickness of the display device, and reducing the border.

TABLE 1

| Solutions | Comparative example (Buffer layer made of foams) | Embodiment 1 | Embodiment 2-1 (Buffer layer made of silica gel) | Embodiment 2-2 (Buffer layer made of polyurethane) |
|---|---|---|---|---|
| Thickness of layers between the first backplate and the heat dissipation support layer | 180 | 200 | 160 | 160 |
| Testing times | 5 | 5 | 5 | 5 |
| Anti-extrusion performance (minimum pressure/N) | 200 | 300 | 280 | 280 |
| | 220 | 320 | 300 | 300 |
| | 260 | 300 | 320 | 300 |
| | 260 | 340 | 320 | 300 |
| | 220 | 340 | 360 | 300 | display device in the present disclosure, a minimum pressure of the display device can be greatly increased when bright spots or black spots appear, that is, the back surface of the display device in the embodiment 1 has an excellent anti-extrusion performance. Moreover, compared to the display device in the comparative example, the design of the notch 141 in the display device of the embodiment 1 can reduce a total thickness of a part of the display device corresponding to the solder pad part, so as to reduce a bending radius, moreover, a total thickness of a part of the display device corresponding to the heat dissipation support layer can be Embodiment 3

Figure 4:
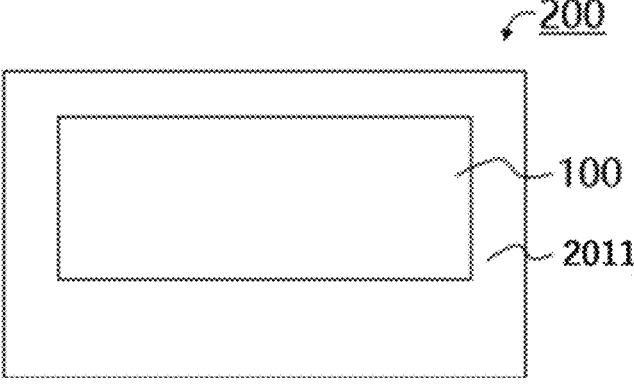
FIG. 4 is a schematic diagram of a display terminal according to an embodiment 3 of the present disclosure.

Referring to FIG. 4, FIG. 4 is a schematic diagram of a display terminal according to the embodiment 3 of the present disclosure.

The embodiment of the present disclosure provides a display terminal 200, which includes the display device 100 described in any of the above-mentioned embodiments, a driver chip 17 is electrically connected to the bending part FF2 of the display panel body 10, and a circuit board (not shown in the figures). Specifically, the driver chip 17 and the circuit board are electrically connected to solder pad terminals of the solder pad part FF3.

Specifically, the display terminal 200 includes a terminal body 2011 and the display device 100 described in any of the above-mentioned embodiments, and the terminal body 2011 is integrated with the display device 100.

Specifically, the display terminal 200 can be a mobile phone, a TV, a laptop, or the like, and the terminal body 2011 can be a structure or a component of the display terminal 200, such as a shell.

The display device and the display terminal provided by the embodiments of the present disclosure are described in detail. In this paper, specific embodiments are adopted to illustrate a principle and implementation modes of the present disclosure. The description of the above-mentioned embodiments is only used to help understand methods and a core idea of the present disclosure. At the same time, for those skilled in the art, according to the idea of the present disclosure, there will be changes in specific implementation modes and a scope of the present disclosure. In conclusion, contents of the specification should not be interpreted as a limitation of the present disclosure.

What is claimed is:

1. A display device, comprising:
a display panel body comprising a flat plate part, a bending part, and a solder pad part, wherein the bending part is disposed between the flat plate part and the solder pad part, and the solder pad part is disposed on a back side of the flat plate part in a bending state;
a backplate layer comprising a first backplate and a second backplate, wherein the first backplate is disposed on the back side of the flat plate part, and the second backplate is disposed on a side of the solder pad part close to the flat plate part;
a rigid support layer attached onto a side of the first backplate away from the flat plate part;
a buffer layer attached onto a side of the rigid support layer away from the flat plate part;
a notch provided at an end of the buffer layer close to the bending part;
an adhesive layer disposed in the notch, wherein the second backplate is attached onto a surface of the adhesive layer away from the rigid support layer; and
a heat dissipation support layer disposed on a side of the buffer layer away from the flat plate part.

2. The display device of claim 1, wherein a thickness of the buffer layer between the adhesive layer and the rigid support layer is 0, and the second backplate is attached onto a surface of the rigid support layer away from the flat plate part through the adhesive layer.

3. The display device of claim 1, wherein a thickness of the buffer layer between the adhesive layer and the rigid support layer is greater than 0, and the second backplate is attached onto a surface of the buffer layer through the adhesive layer.

4. The display device of claim 1, wherein an orthographic projection of the heat dissipation support layer on the flat plate part does not overlap with an orthographic projection of the notch on the flat plate part.

5. The display device of claim 4, wherein a gap is defined between the orthographic projection of the heat dissipation support layer on the flat plate part and the orthographic projection of the notch on the flat plate part.

6. The display device of claim 4, wherein a thickness of a stacked layer between a surface of the flat plate part close to the heat dissipation support layer and a surface of the heat dissipation support layer away from the flat plate part is greater than or equal to a thickness of a stacked layer between a surface of the flat plate part close to the second backplate and a surface of the solder pad part away from the flat plate part.

7. The display device of claim 6, wherein the surface of the heat dissipation support layer away from the flat plate part and the surface of the solder pad part away from the flat plate part are in a same plane.

8. The display device of claim 2, wherein a height between a plane where the surface of the notch is located and a plane where a surface of the heat dissipation support layer away from the flat plate part is located ranges from 100 microns to 235 microns.

9. The display device of claim 3, wherein a height between a plane where the surface of the notch is located and a plane where a surface of the heat dissipation support layer away from the flat plate part is located ranges from 50 microns to 80 microns.

10. The display device of claim 4, wherein both of an elastic modulus of the rigid support layer and an elastic modulus of the heat dissipation support layer are greater than an elastic modulus of the backplate layer, and the elastic modulus of the backplate layer is greater than an elastic modulus of the buffer layer.

11. The display device of claim 10, wherein materials of the rigid support layer comprise stainless steel.

12. The display device of claim 10, wherein a thickness of the buffer layer between the adhesive layer and the rigid support layer is 0, and materials of the buffer layer comprise at least one of silica gel and polyurethane.

13. The display device of claim 10, wherein a thickness of the buffer layer between the adhesive layer and the rigid support layer is greater than 0, and materials of the buffer layer comprise a foam.

14. The display device of claim 8, wherein materials of the heat dissipation support layer comprise at least one of stainless steel, copper alloy, and carbon fiber.

15. The display device of claim 9, wherein materials of the heat dissipation support layer comprise at least one of stainless steel, copper alloy, and carbon fiber.

16. A display terminal, comprising a terminal body and a display device integrated with the terminal body, wherein the display device comprises:
a display panel body comprising a flat plate part, a bending part, and a solder pad part, wherein the bending part is disposed between the flat plate part and the solder pad part, and the solder pad part is disposed on a back side of the flat plate part in a bending state;
a backplate layer comprising a first backplate and a second backplate, wherein the first backplate is disposed on the back side of the flat plate part, and the second backplate is disposed on a side of the solder pad part close to the flat plate part;
a rigid support layer attached onto a side of the first backplate away from the flat plate part;
a buffer layer attached onto a side of the rigid support layer away from the flat plate part;
a notch provided at an end of the buffer layer close to the bending part;
an adhesive layer disposed in the notch, wherein the second backplate is attached onto a surface of the adhesive layer away from the rigid support layer; and
a heat dissipation support layer disposed on a side of the buffer layer away from the flat plate part.

17. The display terminal of claim 16, wherein a thickness of the buffer layer between the adhesive layer and the rigid support layer is 0, and the second backplate is attached onto a surface of the rigid support layer away from the flat plate part through the adhesive layer.

18. The display terminal of claim 16, wherein a thickness of the buffer layer between the adhesive layer and the rigid support layer is greater than 0, and the second backplate is attached onto a surface of the buffer layer through the adhesive layer.

19. The display terminal of claim 16, wherein an orthographic projection of the heat dissipation support layer on the flat plate part does not overlap with an orthographic projection of the notch on the flat plate part.

20. The display terminal of claim 19, wherein a gap is defined between the orthographic projection of the heat dissipation support layer on the flat plate part and the orthographic projection of the notch on the flat plate part.

\* \* \* \* \*